US008282733B2

(12) United States Patent
Yamamoto

(10) Patent No.: US 8,282,733 B2
(45) Date of Patent: Oct. 9, 2012

(54) MANUFACTURING METHOD OF SEMICONDUCTOR APPARATUS

(75) Inventor: Katsuhiko Yamamoto, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1203 days.

(21) Appl. No.: 12/060,511

(22) Filed: Apr. 1, 2008

(65) Prior Publication Data

US 2008/0245303 A1    Oct. 9, 2008

(30) Foreign Application Priority Data

Apr. 2, 2007  (JP) .................................. 2007-096059
Mar. 24, 2008  (JP) .................................. 2008-075763

(51) Int. Cl.
*C30B 23/00*   (2006.01)
*C30B 25/00*   (2006.01)
*C30B 28/12*   (2006.01)
*C30B 28/14*   (2006.01)

(52) U.S. Cl. ............... 117/84; 117/88; 117/89; 117/102
(58) Field of Classification Search .................... 117/84, 117/88, 89, 102
See application file for complete search history.

(56) References Cited

U.S. PATENT DOCUMENTS 6,541,355 B2 *   4/2003   Joo et al. ........................ 438/479
2006/0115934 A1 *   6/2006   Kim et al. ...................... 438/149

FOREIGN PATENT DOCUMENTS

| JP | 5-21357 | 1/1993 |
| JP | 6338613 | 12/1994 |
| JP | 08176829 | 7/1996 |
| JP | 2003-86511 | 3/2003 |
| KR | 20020061523 | 7/2002 |
| WO | 2007013464 | 2/2007 |

* cited by examiner

*Primary Examiner* — James McDonough
(74) *Attorney, Agent, or Firm* — Brundidge & Stanger, P.C.

(57) ABSTRACT

The manufacturing method of a semiconductor apparatus has a step for carrying in the substrate into the processing chamber; a step for heating the processing chamber and the substrate to the predetermined temperature; and a gas supply and exhaust step for supplying and exhausting desired gas into and from the processing chamber, wherein the gas supply and exhaust step repeats by the predetermined times a first supply step for supplying silicon-type gas and hydrogen gas into the processing chamber; a first exhaust step for exhausting at least said silicon-type gas from the processing chamber; a second supply step for supplying chlorine gas and hydrogen gas into the processing chamber; and a second exhaust step for exhausting at least the chlorine gas from the processing chamber.

12 Claims, 5 Drawing Sheets

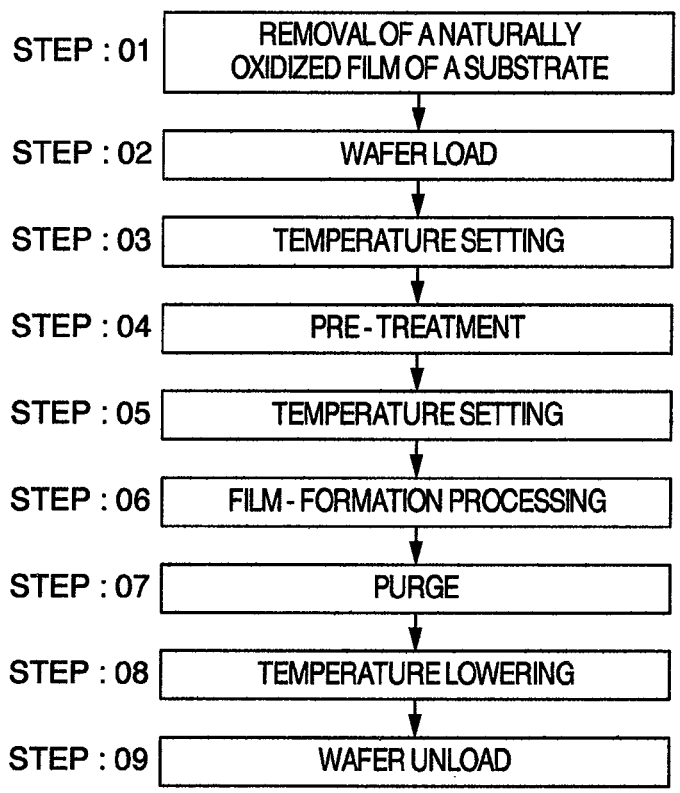
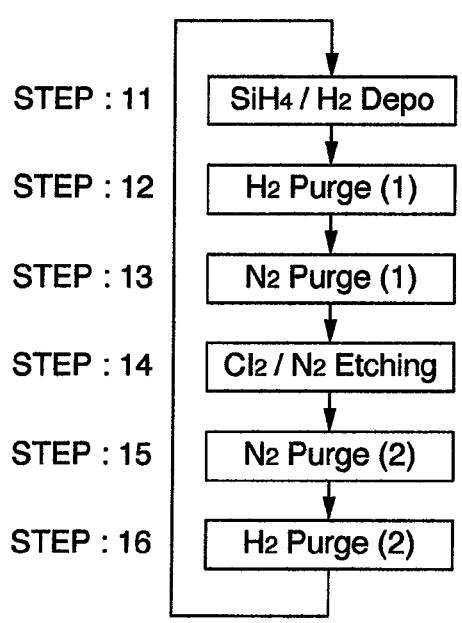
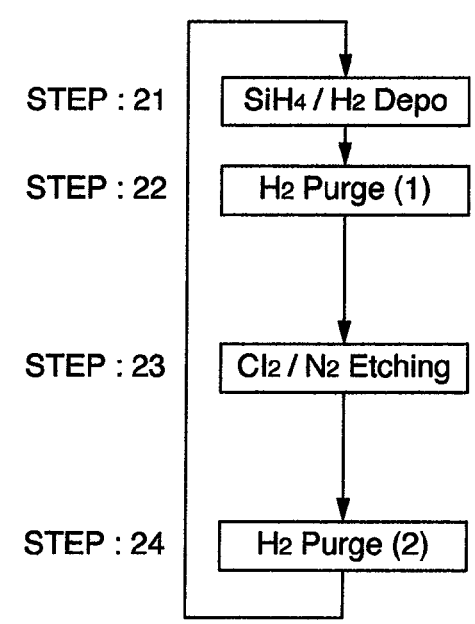

MANUFACTURING METHOD OF SEMICONDUCTOR APPARATUS

INCORPORATION BY REFERENCE

The present application claims priorities from Japanese applications JP2007-096059 filed on Apr. 2, 2007, JP2008-75763 filed on Mar. 24, 2008, the contents of which are hereby incorporated by reference into this application.

BACKGROUND OF THE INVENTION

The present invention relates to a manufacturing method of a semiconductor apparatus for manufacturing a semiconductor apparatus by carrying out processing such as thin film formation, impurity diffusion, annealing processing and etching on a substrate such as a silicon wafer, a glass substrate.

As one of semiconductor apparatuses, there is a MOSFET (Metal Oxide Semiconductor Field Effect Transistor), which is a polymerized structure of a metal, an oxide film and a semiconductor, and in recent years, it has been progressing to attain finer patterning and higher performance of MOSFET.

As a problem in attaining the finer patterning and higher performance MOSFET, there is decrease in contact resistance or the like, and as one method for solving this problem, there is a method of selectively growing a silicon epitaxial film on a source/drain.

Conventionally, growth of a silicon epitaxial film has been carried out by using $SiH_2Cl_2$ and HCl and $H_2$, as processing gas, and by continuously supplying these processing gases into a processing chamber at a processing temperature of from 750° C. to 850° C.

The above processing temperature of 750° C. to 800° C. is high temperature, and accompanying with the finer patterning and higher performance, influence of thermal damage and thermal budget on the substrate element increases, which makes a cause of inhibition of making a higher performance device, or a cause of lower yield.

As conventional technology, JP-A-2003-86511 and JP-A-5-21357 are included.

SUMMARY OF THE INVENTION

It is an object of the present invention, in consideration of the above situation, to provide a manufacturing method of a semiconductor apparatus, which is capable of formation of a high quality film at low temperature, and attains enhancements of device performance as well as yield.

The present invention relates to a manufacturing method of a semiconductor apparatus for selectively growing an epitaxial film at a silicon surface of a substrate, by storing the substrate having at least the silicon surface and an insulating surface at the surface thereof, into a processing chamber, and by using a substrate processing apparatus for heating an atmosphere of the inside of the processing chamber and the substrate to a predetermined temperature by a heating unit installed outside, comprising a step for carrying in the substrate into the processing chamber; a step for heating the atmosphere of the inside of the processing chamber and the substrate to the predetermined temperature; and a gas supply and exhaust step for supplying and exhausting desired gas into and from the processing chamber, wherein the gas supply and exhaust step repeats by the predetermined times and carries out, a first supply step for supplying silicon-containing gas and hydrogen gas into the processing chamber; a first exhaust step for exhausting at least the silicon-containing gas from the processing chamber; a second supply step for supplying chlorine gas and hydrogen gas into the processing chamber; and a second exhaust step for exhausting at least the chlorine gas from the processing chamber.

According to the present invention, there is provided a manufacturing method of a semiconductor apparatus for selectively growing an epitaxial film at a silicon surface of a substrate, by storing the substrate having at least the silicon surface and an insulating surface at the surface thereof into a processing chamber, and by using a substrate processing apparatus for heating an atmosphere of the inside of the processing chamber and the substrate to a predetermined temperature by a heating unit installed outside, comprising a step for carrying in the substrate into the processing chamber; a step for heating the atmosphere of the inside of the processing chamber and the substrate to the predetermined temperature; and a gas supply and exhaust step for supplying and exhausting desired gas into and from the processing chamber, wherein the gas supply and exhaust step repeats by the predetermined times and carries out, a first supply step for supplying silicon-containing gas and hydrogen gas into the processing chamber; a first exhaust step for exhausting at least the silicon-containing gas from the processing chamber; a second supply step for supplying chlorine gas and hydrogen gas into the processing chamber; and a second exhaust step for exhausting at least the chlorine gas from the processing chamber, therefore, throughput is enhanced because a gas purge step by inert gas can be omitted in a step before or after the second supply step, and also, excellent effect of enhancing processing uniformity is exerted, because processing by chlorine gas is carried out by supplying hydrogen gas along with chlorine gas.

Other objects, features and advantages of the invention will become apparent from the following description of the embodiments of the invention taken in conjunction with the accompanying drawings.

BRIEF DESCRIPTION OF THE DRAWINGS

FIG. 3 is a flowchart of a processing step relevant to the present invention.

FIG. 4A is a flowchart showing an example of a first film-formation step of the present invention.

FIG. 4B is a flowchart showing ah example of a second film-formation step of the present invention.

DESCRIPTION OF THE EMBODIMENTS

Explanation will be given below on embodiments for carrying out the present invention with reference to drawings.

First, explanation will be given, in FIG. 1, on a substrate processing apparatus, where the present invention is carried out.

Figure 1:
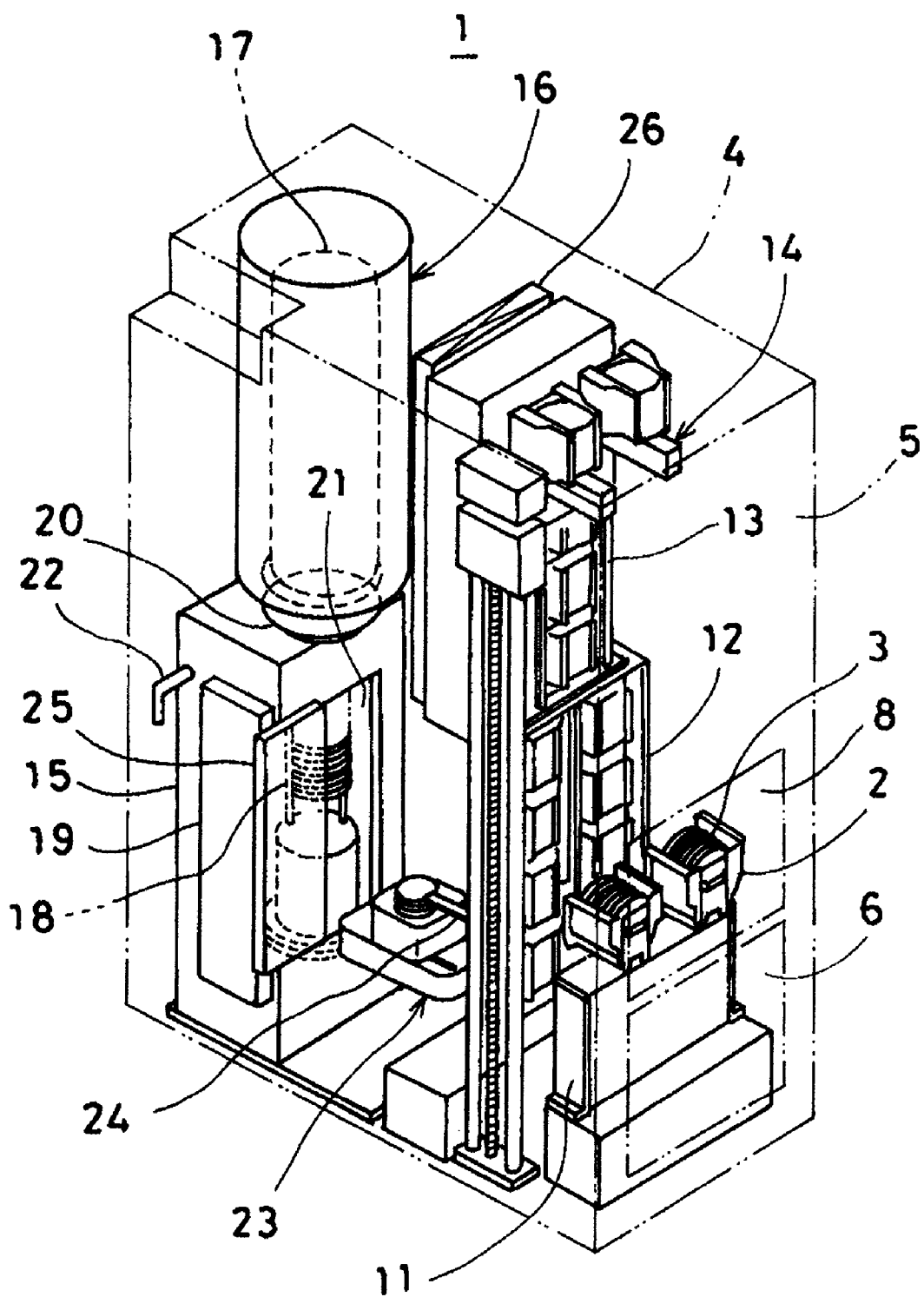
FIG. 1 is a perspective view showing an example of a substrate processing apparatus relevant to an embodiment of the present invention.

In FIG. 1, "1" represents a substrate processing apparatus, "2" represents a substrate storage container (cassette), and a substrate (wafer) "3" such as a silicon wafer, which is processed by the substrate processing apparatus 1, is carried-in or carried-out in a stored state in the cassette 2 in required pieces, for example, 25 pieces.

At the lower part of a front side wall 5 of a housing 4 of the substrate processing apparatus 1, a front side maintenance port 6 is installed as an opening part for maintenance, and said front side maintenance port 6 is designed to be capable of opening and closing by a front side maintenance door (not shown). At the upward of the front side maintenance port 6, there is installed a substrate storage container gateway 8 for carrying in and carrying out the cassette 2, and the substrate storage container gateway 8 is designed to be opened and closed by a gateway opening and closing facility (a front shutter) (not shown).

Adjacent to the inside of the housing 4, and the substrate storage container gateway 8, a substrate storage container receiving apparatus (a cassette receiving stage) 11 is installed, and facing the cassette receiving stage 11, there are installed a lower substrate storage container storage shelf (a cassette shelf) 12, and an upper substrate storage container storage shelf (a buffer cassette shelf) 13, for storing the required pieces of the cassettes 2.

Between the cassette receiving stage 11 and the cassette shelf 12 and the buffer cassette shelf 13, a substrate storage container carrying apparatus (a cassette carrying apparatus) 14 is installed. Said cassette carrying apparatus 14 is provided with a traverse facility, a hoisting facility and a rotation facility, and is capable of carrying the cassette 2 in required position, between the cassette receiving stage 11 and the cassette shelf 12 and the buffer cassette shelf 13, by a cooperation of the traverse facility, the hoisting facility and the rotation facility.

At the backward and the lower part of the inside of the housing 4, a load lock chamber 15, which is an air-tight container, is installed, and at the upper side of the load lock chamber 15, a processing furnace 16 is installed. The processing furnace 16 is provided with an air-tight processing chamber 17, and the processing chamber 17 is connected air-tightly to the load lock chamber 15, and a furnace port part at the lower end of the processing chamber 17 is designed to be blockable air-tightly by a furnace port gate valve 20.

At the inside of the load lock chamber 15, a substrate holding tool (a boat) 18 can be stored, and said boat 18 is made of a heat resistant material, for example, quartz or silicon carbide or the like, which is designed to be capable of holding the wafer 3 in multiple stages, in a horizontal position. In addition, it is preferable that a shelf for supporting the wafer 3 is casted in a ring-like shape. It should be noted that at the lower part of the boat 18, there are installed in multiple stages and in a horizontal position, multiple pieces of heat insulating plates (not shown) as a heat insulating member with a circular plate-like shape, made of a heat resistant material of, for example, quartz or silicon carbide or the like, so as to inhibit heat radiation downward.

In addition, there is installed a substrate holding tool hoisting facility (a boat elevator) 19 for supporting the boat 18, and for mounting and dismounting said boat 18 to and from the processing chamber 17, at the load lock chamber 15.

Said load lock chamber 15 is provided with a substrate transfer port 21 for transferring the wafer 3 onto the boat 18, and said substrate transfer port 21 is released and also blocked air-tightly by a gate valve 25. At the load lock chamber 15, there is connected a gas supply system 22 for supplying inert gas such as nitrogen gas, and also connected an exhaust apparatus (not shown) for exhausting the inside of the load lock chamber 15 to make negative pressure.

Between the load lock chamber 15 and the cassette shelf 12, a substrate transfer apparatus (a substrate transfer machine) 23 is installed, and said substrate transfer machine 23 is provided with required pieces (for example, 5 pieces) of substrate holding plate 24 for mounting and holding the wafer 3, as well as provided with an hoisting facility part for hoisting the substrate holding plates 24, a rotation facility part for rotation thereof, and a forward and backward movement facility part for making forward and backward movement thereof.

The substrate transfer machine 23 is designed so that a substrate is transferred between the boat 18 in a descending state and the cassette shelf 12, via the substrate transfer port 21, by cooperation of the hoisting facility part, the rotation facility part and the forward and backward movement facility part.

It should be noted that at a required position of the inside of the housing 4, for example, a clean unit 26 is installed facing the buffer cassette shelf 13, and flow of clean atmosphere is formed in the inside of the housing 4 by said clean unit 26.

Explanation will be given below on actuation of the substrate processing apparatus 1.

The substrate storage container gateway 8 is released by a front shutter (not shown), and the cassette 2 is carried in from the substrate storage container gateway 8. The cassette 2 carried in is mounted so that the wafer 3 takes a vertical position and a gateway of the wafer 3 faces an upward direction.

Then, by the cassette carrying apparatus 14, the cassette 2 is carried to a designated shelf position of the cassette shelf 12 or the buffer cassette shelf 13. The cassette 2 stored at the cassette shelf 12 or the buffer cassette shelf 13 is set to take horizontal position and the gateway faces the substrate transfer machine 23. In addition, after being temporarily stored, the cassette 2 is transferred from the buffer cassette shelf 13 to the cassette shelf 12 by the cassette carrying apparatus 14.

Inside of the load lock chamber 15 is made in an atmospheric pressure state in advance, and the boat 18 is descended to the inside of the load lock chamber 15 by the boat elevator 19. By the gate valve 25, the substrate transfer port 21 is released, and by the substrate transfer machine 23, the wafer 3 is transferred into the boat 18 from the cassette 2.

When previously designated pieces of the wafers 3 are charged onto the boat 18, the substrate transfer port 21 is closed by the gate valve 25, and a pressure of the load lock chamber 15 is reduced by vacuuming with an exhaust apparatus. When the pressure of the load lock chamber 15 is reduced to the same pressure in the processing chamber 17, the furnace port part of the processing chamber 17 is released by the furnace port gate valve 20, and the boat 18 is charged into the processing chamber 17 by the boat elevator 19.

The wafer 3 is subjected to predetermined processing by carrying out the heating of the wafer 3, the introduction of processing gas into the processing chamber 17 and exhaustion or the like.

After processing, the boat 18 is taken out by the boat elevator 19, and still more, after pressure in the load lock chamber 15 is restored to atmospheric pressure, the gate valve 25 is opened. After that, the wafer 3 and the cassette 2 are carried out to the outside of the housing 4 by reversed procedure of the above.

Then explanation will be given, in FIG. 2, on the processing furnace 16 and the boat elevator 19.

Figure 2:
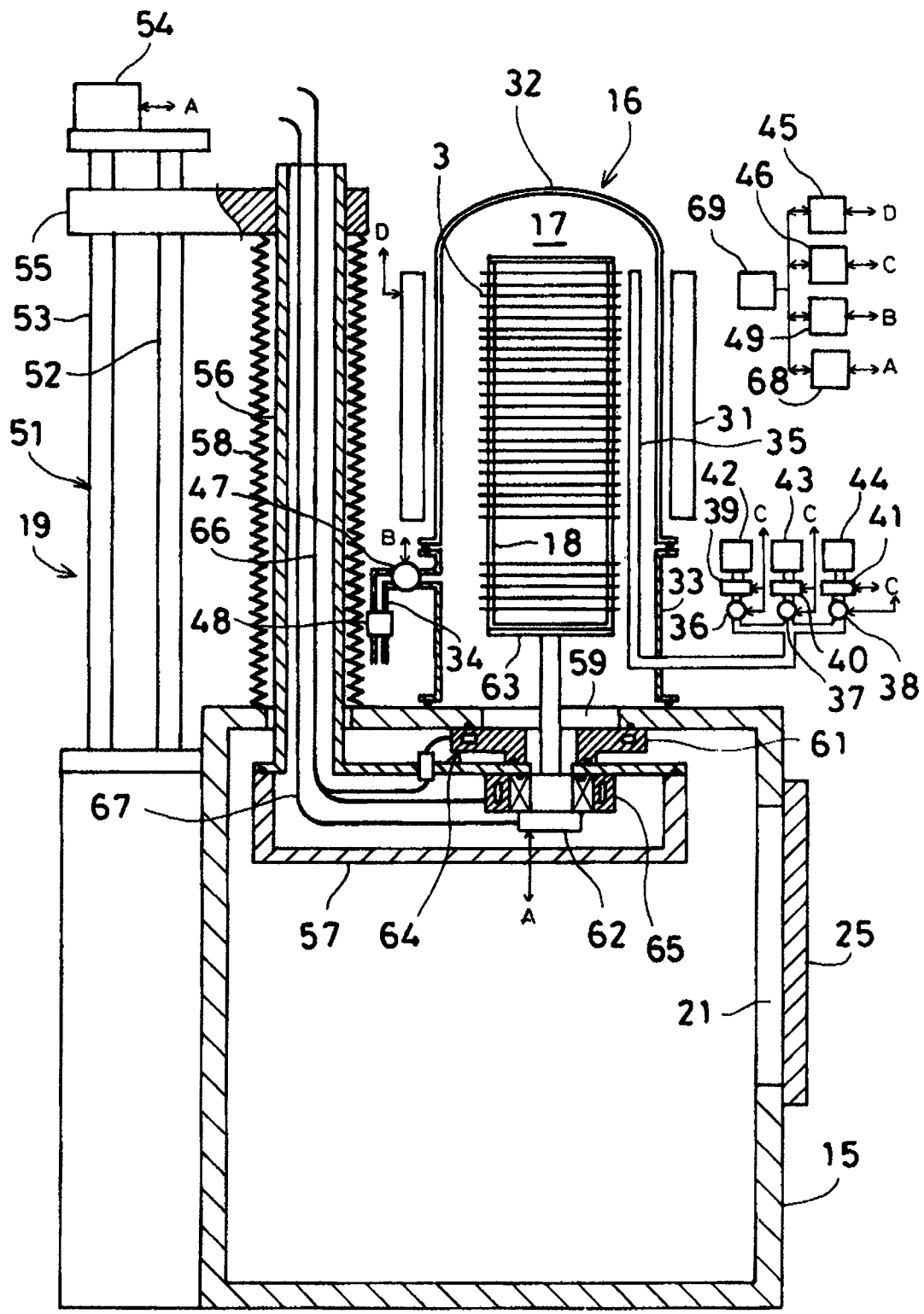
FIG. 2 is a schematic cross-sectional view of a processing furnace used in the substrate processing apparatus.

As shown in FIG. 2, the processing furnace 16 has a heater 31 as heating facility. Said heater 31 has a circular cylinder-like shape and is configured by a heater element line and an insulating member installed at the circumference thereof, and is installed vertically by being supported by a holding body not shown.

At the vicinity of the heater 31, a temperature sensor (not shown) is installed as a temperature detecting body for detecting temperature in the processing chamber 17. A temperature control part 45 is electrically connected to the heater 31 and the temperature sensor, and it is configured so as to control in desired timing so that temperature in the processing chamber 17 becomes desired temperature distribution by adjusting a current-carrying state to the heater 31 based on temperature information detected by the temperature sensor.

At the inside of the heater 31, a reaction tube 32 is installed concentrically with the heater 31. Said reaction tube 32 is made of a heat resistant material such as quartz ($SiO_2$) or silicon carbide (SiC), and is formed in a circular cylinder-like shape with the upper end blocked and the lower end opened. The reaction tube 32 configures the processing chamber 17, stores the boat 18, and the wafer 3 is stored in the processing chamber 17 in a state held in the boat 18.

At the downward of the reaction tube 32, a manifold 33 is installed concentrically with the reaction tube 32, and the reaction tube 32 is installed at the manifold 33. Said manifold 33 is made of, for example, stainless steel or the like, and is formed in a circular cylinder-like shape with the upper end and the lower end opened. It should be noted that between the manifold 33 and the reaction tube 32, an O-ring is installed as a sealing member. The manifold 33 is supported by a holding body, for example, the load lock chamber 15, and thereby the reaction tube 32 becomes in a vertically installed state. A reaction container is formed by said reaction tube 32 and the manifold 33.

At said manifold 33, an exhaust pipeline 34 is installed, as well as a gas supply pipeline 35 is installed so as to pass through. The gas supply pipeline 35 is branched into three at the upstream side, and connected to a first gas supply source 42, a second gas supply source 43 and a third gas supply source 44, via valves 36, 37 and 38, and MFCs 39, 40 and 41 as gas flow amount control apparatus, respectively. It is designed that the first gas supply source 42 supplies, for example, silane-type gas or halogen-containing silane-type gas as processing gas, the second gas supply source 43 supplies hydrogen gas as processing gas or carrier gas, and in addition, the third gas supply source 44 supplies nitrogen gas as carrier gas or purging gas.

A gas flow amount control part 46 is electrically connected to the MFCs 39, 40 and 41, and the valves 36, 37 and 38, and said gas flow amount control part 46 is configured to control in desired timing so that flow amount of supplying gas becomes desired flow amount.

At the lower stream side of the exhaust pipeline 34, a vacuum exhaustion apparatus 48 such as a vacuum pump is connected, via a pressure sensor as a pressure detector not shown, and an APC valve 47 as a pressure regulator. As the vacuum exhaustion apparatus 48, it is preferable that a ternary vacuum pump system with high exhaustion capability, for example, a molecular turbo pump+a machine booth and a pump+a dry pump or the like are used.

A pressure control part 49 is electrically connected to the pressure sensor and the APC valve 47, and said pressure control part 49 is configured so as to control in desired timing so that pressure of the processing chamber 17 becomes desired pressure by adjusting degree of opening of the APC valve 47, based on pressure detected with the pressure sensor.

In the configuration of the processing furnace 16, the first processing gas is supplied from the first gas supply source 42, and is introduced into the processing chamber 17 by the gas supply pipeline 35, via the valve 36, after adjustment of flow amount thereof by the MFC 39. The second processing gas is supplied from the second gas supply source 43, and is introduced into the processing chamber 17 by the gas supply pipeline 35, via the valve 37, after adjustment of flow amount thereof by the MFC 40. The third processing gas is supplied from the third gas supply source 44, and is introduced into the processing chamber 17 by the gas supply pipeline 35, via the valve 38, after adjustment of flow amount thereof by the MFC 41. In addition, gas in the processing chamber 17 is exhausted from the processing chamber 17 by the vacuum exhaustion apparatus 48 connected to the exhaust pipeline 34.

Then explanation will be given on the boat elevator 19.

The drive facility part 51 of said boat elevator 19 is installed at the side wall of the load lock camber 15.

The drive facility part 51 is provided with a guide shaft 52 installed in parallel and a ball screw 53, and said ball screw 53 is supported in a free-rotation state, and is designed to be rotated by a hoisting motor 54. A hoisting platform 55 is engaged slidably to the guide shaft 52, as well as screwed in to the ball screw 53, and at the hoisting platform 55, a hollow hoisting shaft 56 is installed vertically in parallel to the guide shaft 52.

Said hoisting shaft 56 is extended inside by passing thorough freely a ceiling surface of the load lock chamber 15, and at the lower end thereof, a hollow drive part storage case 57 is installed air-tightly. A bellows 58 is installed so as to cover the hoisting shaft 56 in non-contact state, and the upper end of the bellows 58 is fixed at the lower surface of the hoisting platform 55, and the lower end of the bellows 58 is fixed at the upper surface of the load lock chamber 15, each air-tightly, and a free passing through part of the hoisting shaft 56 and said hoisting shaft 56 are sealed air-tightly.

At the ceiling part of the load lock chamber 15, a furnace port 59 is installed concentrically with the manifold 33, and the furnace port 59 is designed to be blockable air-tightly by a seal cap 61. Said seal cap 61 is, for example, made of metal such as stainless steel, and formed in a circular disk-like shape, and fixed air-tightly at the upper surface of the drive part storage case 57.

The drive part storage case 57 has an air-tight structure, and the inside thereof is isolated from atmosphere in the load lock chamber 15. At the inside of the drive part storage case 57, a boat rotation facility 62 is installed, and the rotation axis of the boat rotation facility 62 is extended upward by passing through freely a top panel of the drive part storage case 57 and the seal cap 61, and at the upper end thereof, a boat mounting platform 63 is fixed, and the boat 18 is mounted on the boat mounting platform 63.

The seal cap 61 and the boat rotation facility 62 are each cooled by a water-cooling-type cooling facilities 64 and 65, and a cooling-water pipeline 66 to the cooling facilities 64 and 65 is connected to an external cooling water source (not shown) after passing the hoisting shaft 56. In addition, power supply to the boat rotation facility 62 is carried out via a power supply cable 67 wired through the hoisting shaft 56.

A drive control part 68 is electrically connected to the boat rotation facility 62 and the hoisting motor 54, and it is configured so as to control in desired timing to perform desired motion.

The temperature control part 45, the gas flow amount control part 46, the pressure control part 49 and the drive control part 68 configure also an operation part and an input-output part, and electrically connected to a main control part 69 for controlling whole part of the substrate processing apparatus 1.

As described above, a drive part of the boat elevator 19, the boat rotation facility 62, the cooling-water pipeline 66, the power supply cable 67 and the like are isolated from the inside of the load lock chamber 15, by the drive part storage case 57 and the bellows 58, therefore, there is no risk that the wafer 3 is contaminated by organic substances and particles emitted from a driving system and a wiring system, by residual heat in vacuuming of the load lock chamber 15, or in releasing of the furnace port gate valve 20.

Then, explanation will be given on a method for carrying out film-formation processing on a substrate such as the wafer 3, as one step of production steps of a semiconductor device, by using the processing furnace 16, with reference to FIG. 3.

It should be noted that in the following explanation, movement of each part configuring the substrate processing apparatus 1 is controlled by the main control part 69.

First, a naturally oxidized film on the surface of the wafer 3 is removed with diluted hydrofluoric acid, and at the same time, the surface was subjected to hydrogen termination (STEP: 01).

The boat 18 is descended by the boat elevator 19, and the furnace port 59 is blocked air-tightly by the furnace port gate valve 20. The substrate transfer port 21 is released by the gate valve 25, in a state that the inside of the load lock chamber 15 becomes a state having the same pressure as that in the outside of the load lock chamber 15. By the substrate transfer machine 23, predetermined pieces of the wafers 3 are charged onto the boat 18 (STEP: 02).

The substrate transfer port 21 is blocked air-tightly by the gate valve 25, and the inside of the load lock chamber 15 is subjected to repeated vacuuming and purging by inert gas (for example, nitrogen gas) to remove oxygen and moisture in the atmosphere of the inside of the load lock chamber 15.

Then, the furnace port 59 is released by the furnace port gate valve 20, and the boat elevator 19 is driven. The ball screw 53 is rotated by the drive of the hoisting motor 54, and the drive part storage case 57 is ascended via the hoisting platform 55 and the hoisting shaft 56, and the boat 18 is charged into the processing chamber 17. In this state, the seal cap 61 blocks the furnace port 59 air-tightly via an O-ring.

It should be noted that temperature of the processing chamber 17 at charging is set at 200° C. or around 200° C., to prevent surface oxidation of the wafer 3 (STEP: 03).

The inside of the processing chamber 17 is subjected to vacuum exhausting by the vacuum exhaustion apparatus 48, so as to become desired pressure (degree of vacuum). In this case, pressure in the processing chamber 17 is measured with a pressure sensor, and based on this pressure measured, the APC valve 47 is feed-back controlled. In addition, the processing chamber 17 is heated by the heater 31 so that the inside thereof becomes desired temperature and desired temperature distribution, and the heating state is feed-back controlled by the temperature control part 45, based on temperature information detected by the temperature sensor. Subsequently, the wafer 3 is rotated by rotation of the boat 18, by the boat rotation facility 62.

When the boat 18 is charged into the processing chamber 17 and exhaustion is completed, the processing chamber is set at pre-treatment temperature (it is usually the same as film-formation temperature, however, in treatment with only $H_2$ gas, it is from 750 to 800° C. Treatment under raising temperature after charging the boat is also possible), and pre-treatment is carried out. For the pre-treatment, hydrogen gas or silane-type gas (for example, $SiH_4$), or halogen-containing silane gas or hydrogen chloride gas, or combination gas thereof is supplied along with inert gas or carrier gas such as hydrogen gas, from the first gas supply source 42, the second gas supply source 43 and the third gas supply source 44, via the MFCs 39, 40 and 41 (STEP: 04).

By carrying out the pre-treatment, interface oxygen and carbon density can be reduced, and high quality interface can be formed between a semiconductor substrate and a thin film.

After completion of the pre-treatment, residual gas in the processing chamber 17 is removed by carrier gas such as hydrogen.

Temperature of the processing chamber 17 is adjusted from pre-treatment temperature to film-formation temperature. In this time, hydrogen gas is flown to the processing chamber 17, as carrier gas, to prevent contamination caused by reversed diffusion from an exhaustion system (STEP: 05).

When temperature of the processing chamber 17 is stabilized at film-formation temperature, processing gas is introduced to carry out film-formation processing. Each processing gas is supplied from the first gas supply source 42, the second gas supply source 43 and the third gas supply source 44. In addition, after adjustment the degree of opening of the MFCs 39, 40 and 41, so as to attain desired flow amount, the valves 36, 37 and 38 are opened, and each processing gas is introduced into the processing chamber 17 from the upper part of the processing chamber 17, by flowing through the gas supply pipeline 35.

As processing gas to be introduced, silane-type gas ($SiH_4$), or halogen gas-containing gas or silane-type gas mixed with hydrogen gas, or halogen-containing silane-type gas mixed with hydrogen gas is used. In the case where processing gas is $SiH_4$, film-formation temperature in the processing chamber 17 is adjusted at from 500 to 700° C.

Introduced processing gas passes through the inside of the processing chamber 17, and is exhausted from the exhaust pipeline 34. Processing gas contacts with the wafer 3 in passing through the inside of the processing chamber 17, to grow and deposit an EPI film on the surface of the wafer 3. In addition, unnecessary nuclei on an insulating film are removed by etching processing. A predetermined film is formed by repeating by the predetermined time's film-formation and etching (STEP: 06).

When previously set time elapsed, inert gas is supplied from an inert gas supply source not shown, and the inside of the processing chamber 17 is replaced with inert gas, as well as pressure in the processing chamber 17 is restored to normal pressure (so as to be the same pressure as that of the inside of the load lock chamber 15) (STEP: 07).

After that, temperature in the processing chamber 17 is lowered to a temperature of, for example, 200° C., that is, temperature at which the surface of the wafer 3 is not oxidized (STEP: 08).

The seal cap 61 is descended by the boat elevator 19, and the boat 18 is carried out from the furnace port 59 into the inside of the load lock chamber 15 with opening of the furnace port 59. The furnace port 59 is blocked by the furnace port gate valve 20. After the wafer 3 is cooled to required temperature in the load lock chamber 15, the substrate transfer port 21 is released to take out the processed wafer 3 from the boat 18 by the substrate transfer machine 23 (refer to FIG. 1) (STEP: 09).

Explanation will be given, in FIGS. 4A and 4B, on an example of film-formation step of the STEP: 06.

First, FIG. 4A shows an example of the first film-formation step, and shows the case where $Cl_2$ is introduced by using $N_2$ as carrier gas, in carrying out etching.

First, $SiH_4$ and $H_2$ are introduced for film-formation (STEP: 11).

By simultaneous introduction of $SiH_4$ and $H_2$, the processing chamber 17 is maintained clean, and in addition, although $SiH_4$ is decomposed to $Si+2H_2$, by presence of $H_2$, which was supplied simultaneously, the decomposition action is inhibited. That is, by simultaneous introduction of $SiH_4$ and $H_2$, decomposition degree of $SiH_4$ can be controlled.

After that, $SiH_4$ is excluded from the processing chamber 17 by $H_2$ purge (STEP: 12). The $H_2$ purge removes processing gas, as well as brings the substrate surface H-termination.

Then, after introduction of nitrogen gas for $N_2$ purge (STEP: 13), $Cl_2$ and $N_2$ are introduced to remove (etching) unnecessary nuclei on the insulating film (STEP: 14). Then, $Cl_2$ is excluded from the processing chamber 17, by $N_2$ purging (STEP: 15), and still more $N_2$ is excluded by $H_2$ purging (STEP: 16).

The STEP: 11 to the STEP: 16 are repeated to form a desired film.

Still more, in the case of forming an impurity diffused film, doping gas such as $PH_3$, $B_2H_6$, $BCl_3$ is introduced in the midway of the STEP: 11 to the STEP: 16.

In the present step, because $SiH_4$ is used as film-formation gas, film-formation temperature can be set as low as from 500 to 700° C., and influence of thermal damage or thermal budget on a substrate element can be alleviated. In addition, in the case where $Si_2H_6$ is used as a film-forming gas, it is possible to set film-formation temperature as low as from 450 to 700° C. compared with the case where $SiH_4$ is used.

Then, FIG. 4B shows an example of the second film-formation step, and shows the case where $Cl_2$ is introduced by using $H_2$ as carrier gas, in carrying out etching.

First, $SiH_4$ and $H_2$ are introduced for film-formation (STEP: 21). In this case, it is preferable that flow amount of $SiH_4$ gas is from 100 to 500 sccm, flow amount of $H_2$ gas is from 100 to 20000 sccm, processing temperature is from 500 to 700° C., and processing pressure is equal to or lower than 1000 Pa.

The fact that decomposition degree of $SiH_4$ is controlled by simultaneous introduction of $SiH_4$ and $H_2$, is similar to explanation in FIG. 4A.

After that, $SiH_4$ is excluded from the processing chamber 17 by $H_2$ purge (STEP: 22). The $H_2$ purge removes processing gas, as well as brings the substrate surface H-termination.

Then, $Cl_2$ and $H_2$ are introduced to remove (by etching) unnecessary nuclei on the insulating film (STEP: 23). In this case, it is preferable that flow amount of $Cl_2$ gas is from 50 to 200 sccm, flow amount of $H_2$ gas is from 100 to 20000 sccm, processing temperature is from 500 to 700° C., and processing pressure is equal to or lower than 1000 Pa.

Then, $Cl_2$ is excluded by $H_2$ purge (STEP: 24). Because $Cl_2$ is diluted with $H_2$ in etching, uniformity of etching is enhanced.

STEP: 21 to STEP: 24 are repeated to form a desired film.

Still more, in the case of forming an impurity diffused film, doping gas such as $PH_3$, $B_2H_6$, $BCl_3$ is introduced in the midway of the STEP: 21 to the STEP: 24.

In addition, depending on film-formation state, a flow amount of one or more kinds of gas among $SiH_4$, $Cl_2$ and $H_2$ is changed in the gas introduction step in the STEP: 21 and the STEP: 23.

For example, by increasing the flow amount of $SiH_4$, film-formation rate is increased, and by increasing the flow amount of $Cl_2$, etching amount is increased. Therefore, by changing the flow amount of gas, the following embodiments become possible.

Figure 5:
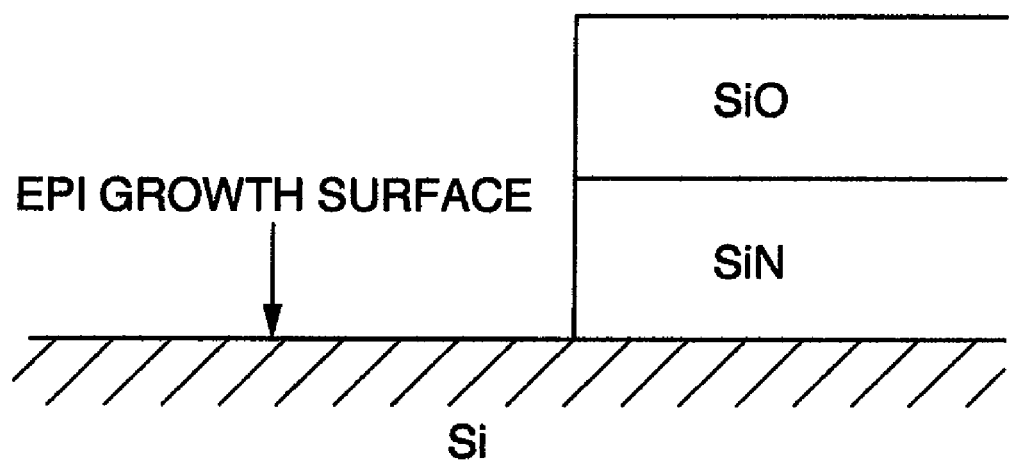
FIG. 5 is an explanation drawing showing a film-formation state in the present invention.

For example, SiN and SiO have characteristics that growth of an Si nucleus is easy, and growth of an Si nucleus is difficult, respectively. Therefore, for example, an insulating film SiO is formed in an overlapped state on an insulating film SiN, and on a substrate with the end surfaces of both insulating films exposed (refer to FIG. 5), in the initial film-formation processing, etching rate is strengthened (film-formation rate is slowed), and when thickness of the film formed is over thickness of the SiN, etching rate is weakened to be able to increase film-formation rate.

In addition, for example, when impurity is present on an Si surface, which is a target of film-formation processing, the film tends to be poly silicon film, therefore, etching rate is strengthened at the early growth stage to carry out film-formation while removing the impurity, and when an EPI film is formed in certain degree, etching rate is weakened to increase film-formation rate.

It should be noted that by increasing processing pressure, etching action and film-formation action are increased, therefore also by changing processing pressure during the film-formation processing, the above embodiment can be obtained.

Also in the second film-formation step, because $SiH_4$ is used as film-formation gas, film-formation temperature can be set as low as from 500 to 700° C., and influence of thermal damage or thermal budget on a substrate element can be alleviated. In addition, in the case where $Si_2H_6$ is used as a film-forming gas, it is possible to set film-formation temperature as low as from 450 to 700° C. compared with the case where $SiH_4$ is used.

Still more, in the second film-formation step, because $Cl_2$ and $H_2$ are introduced as processing gas in etching, purging of $N_2$ is not necessary before or after the etching step, and a purge step of $N_2$ can be omitted, therefore simplification of the film-formation step and shortening of the processing time are possible, and throughput is enhanced.

In addition, uniformity of film-formation in an example of the first film-formation step is about 20%, and uniformity of film-formation in an example of the second film-formation step is from 5 to 10%, therefore enhancement of quality of a film formed was obtained in the example of the second film-formation step as compared with the example of the first film-formation step.

Figure 6:
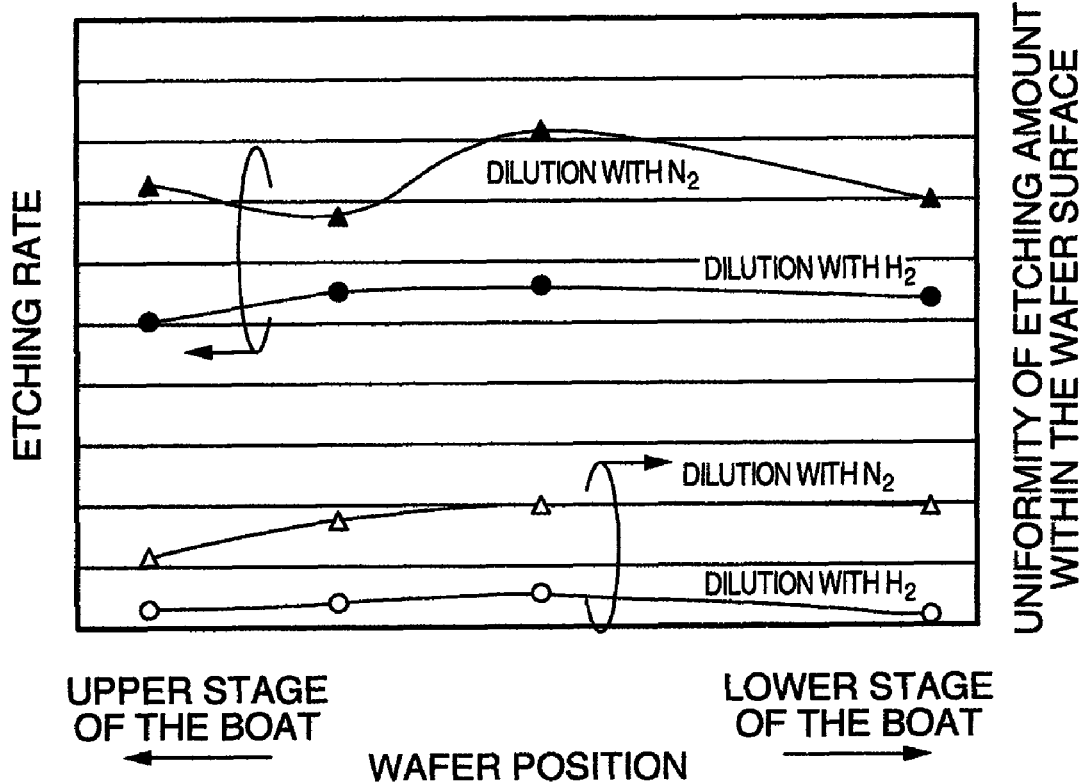
FIG. 6 is a drawing showing etching data of a comparative experiment of the present invention.

In FIG. 6, when the etching is carried out using $Cl_2$ to the monitor wafer formed Poly-Si film, there are shown the experimental results that the etching rate and the uniformity in wafer surface of etching amount are compared, respectively, in the case where $N_2$ is used and $H_2$ is used as a carrier gas.

In FIG. 6, marks ▲ and ● represent etching rate, and marks Δ and ○ represent uniformity in wafer surface of etching amount.

The experiment was carried out under the following conditions:

| | |
|---|---|
| Processing temperature: | 620° C. |
| Total pressure: | 2 Pa |
| $Cl_2$ partial pressure: | 0.04 Pa |
| $N_2$ partial pressure: | 1.96 Pa |
| $H_2$ partial pressure: | 1.96 Pa |

Each value obtained by the experiment carried out under the above conditions is shown in Table 1. From these results, it is understood that etching by the case used $H_2$ as a carrier gas provides lower etching rate and better uniformity in surface of etched amount, as compared with etching by the case used $N_2$ as a carrier gas. Therefore, it can be said that etching by the case used $H_2$ as a carrier gas is capable of enhancing uniformity of film-formation.

In addition, from FIG. 6, it is understood that etching by the case used $H_2$ as a carrier gas is capable of enhancing also uniformity between the wafer.

TABLE 1

|  | $N_2$ dilution | $H_2$ dilution |
|---|---|---|
| Etching rate (Å/min) | 12 to 16 | 10 to 12 |
| Uniformity of etching amount within the surface (%) | ~±10 | ~±5 |

Next, it is described the reason why, when the etching is carried out using $Cl_2$ as a carrier gas, the case used $H_2$ as a carrier gas provides better uniformity of etching, as compared with the case used $N_2$ as a carrier gas.

When the etching is carried out only by $Cl_2$ without using carrier gas, and when the etching is carried out using $N_2$ as carrier gas, etching of $Cl_2$ becomes dominant. Therefore, etching at the edge part of a wafer becomes strong, and gas is almost consumed at the edge part, resulting in no reaching of etching gas to the center part of the wafer, which lowers uniformity.

On the other hand, when $H_2$ is used as a carrier gas, $Cl_2$ and $H_2$ react in the gas phase to form an intermediate, and then the reaction to form 2HCl occurs partially resulting in lowering the etching power. Because an intermediate of HCl is formed during the process thereof, etching gas is capable of reaching the center part of the wafer, therefore, it is considered that uniformity is improved.

In addition, it is considered to be one reason that the wafer surface is covered with H, which then reduces etching effect of Cl and increases amount of gas reaching to the center part of the wafer.

Further, it is described the reason why, when the etching is carried out using $H_2$ as a carrier gas, the case used $Cl_2$ as an etching gas is effective, as compared with the case used HCl as an etching gas.

Because the processing furnace 16 has a hot wall structure, is subjected to etching with gas decomposed in gas phase. However, HCl takes a long time to be decomposed at low processing temperature as in the present application, therefore it is difficult to secure selectivity. On the other hand, $Cl_2$ provides rapid progress of thermal decomposition even in low temperature processing, therefore $Cl_2$ provides higher etching rate, and is capable of securing higher selectivity.

And, the relation of this etching power does not change even in the case of dilution with $H_2$, and because the case used $Cl_2$ as an etching gas provides stronger etching power than the case used HCl as an etching gas, the case used $Cl_2$ as an etching gas is capable of providing better result in low temperature processing like in the present application.

It should be noted that, because of occurrence of a reaction that an intermediate of HCl is generated in vapor phase by heat, uniformity of film-formation can be improved by using $Cl_2$ as etching gas, using $H_2$ as carrier gas as above. Therefore, because of a hot wall structure, where atmosphere in the reaction tube is heated, effect of the present application invention is attained.

It should be noted that explanation has been given on formation of an EPI-Si film on a substrate in the above embodiments, however, the present invention is capable of being carried out also in a single crystal film, a polycrystal film, an amorphous film or the like, or a doped single crystal film, a doped polycrystal film, a doped amorphous film or the like.

Still more, as a substrate processing apparatus where the present invention is carried out, there can be included a substrate processing apparatus in general such as a lateral-type substrate processing apparatus, and for example, also a sheet-type, hot wall-type substrate processing apparatus.

(Additional Statement)

In addition, the present invention includes the following embodiments.

(Additional Statement 1)

A manufacturing method of a semiconductor apparatus for selectively forming a thin film on a silicon substrate by a reduced pressure CVD method (Chemical Vapor Deposition), characterized in that the thin film with high quality interface is grown by intermittently supplying, in an alternately repeating state, silane-type gas such as $SiH_4$ and halogen-type gas such as $Cl_2$, together with hydrogen gas, into a reaction furnace, and in addition, without making a silicon film or a silicon nucleus grown on an insulating film such as silicon nitride film, so as to secure selectivity.

(Additional Statement 2)

A manufacturing method of a semiconductor apparatus by changing flow amount of one or more of silane-type gas such as $SiH_4$ and halogen-type gas such as $Cl_2$, and hydrogen gas, during the repeating cycle shown in the Additional Statement 1.

(Additional Statement 3)

A manufacturing method of a semiconductor apparatus by changing pressure in the reaction furnace during the repeating cycle shown in the Additional Statement 1 and the Additional Statement 2.

(Additional Statement 4) A manufacturing method of a semiconductor apparatus by introducing doping gas such as $PH_3$, $B_2H_6$ and $BCl_3$ during the repeating cycle shown in the Additional Statement 1, the Additional Statement 2 and the Additional Statement 3.

(Additional Statement 5)

A manufacturing method of a semiconductor apparatus, in any of the Additional Statement 1, Additional Statement 2 and Additional Statement 3, in introducing a silicon substrate and a tool (boat) for silicon substrate processing from a front chamber of a reaction furnace into the reaction furnace, where the drive axis part thereof and a boat rotation facility part and a wiring part are isolated from the front chamber of the reaction furnace.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A manufacturing method of a semiconductor apparatus for selectively growing an epitaxial film at a silicon surface of a substrate, by storing the substrate having at least the silicon surface and an insulating surface at the surface thereof into a processing chamber, and by using a substrate processing apparatus for heating an atmosphere of the inside of said processing chamber and said substrate to a selected temperature by a heating unit installed at the outside of said processing chamber, comprising:

a step of carrying in the substrate into said processing chamber;

a step of heating the atmosphere of the inside of said processing chamber and said substrate to the selected temperature; and a gas supply and exhaust step of supplying and exhausting desired gas into and from said processing chamber;

wherein said gas supply and exhaust step comprises:

a first supply step of supplying silicon-containing gas and hydrogen gas into said processing chamber;

a first exhaust step of exhausting at least said silicon-containing gas from said processing chamber by supplying a first hydrogen as purge into said processing chamber;

supplying a first nitrogen gas purge into said processing chamber, and then supplying chlorine-containing gas and nitrogen gas into said processing chamber;

exhausting the chlorine containing gas from said processing chamber by supplying a second nitrogen gas purge into said processing chamber, and exhausting said nitrogen gas from said processing chamber by supplying a second hydrogen gas purge;

a second supply step of supplying chlorine-containing gas and hydrogen gas into said processing chamber; and a second exhaust step of exhausting at least said chlorine-containing gas from said processing chamber;

and said gas supply and exhaust step is repeated by a selected number of times.

2. The manufacturing method of the semiconductor apparatus according to claim 1, wherein said silicon-containing gas comprises at least one of a silane-type gas, a halogen gas-containing gas, or a halogen-containing silane-type gas.

3. The manufacturing method of the semiconductor apparatus according to claim 1, wherein at least said second supply step is carried out under the atmosphere of the inside of said processing chamber and under heating said substrate at equal to or lower than 700° C. by said heating unit.

4. The manufacturing method of the semiconductor apparatus according to claim 1, wherein $SiH_4$ is used as said silicon-containing gas, and at least said second supply step is carried out under the atmosphere of the inside of said processing chamber and under heating said substrate at the selected temperature of from 500° C. to 700° C. by said heating unit.

5. The manufacturing method of the semiconductor apparatus according to claim 1, wherein $Si_2H_6$ is used as said silicon-containing gas, and at least said second supply step is carried out under the atmosphere of the inside of said processing chamber and under heating said substrate at the selected temperature of from 450° C. to 700° C. by said heating unit.

6. The manufacturing method of the semiconductor apparatus according to claim 1, wherein said gas supply and exhaust step further comprises a third supply step of supplying doping gas into said processing chamber.

7. The manufacturing method of the semiconductor apparatus according to claim 5, wherein said doping gas is any of $PH_3$, $B_2H_6$ and $BCl_3$.

8. The manufacturing method of the semiconductor apparatus according to claim 1, wherein, in said gas supply and exhaust step, said silicon-containing gas, said chlorine-containing gas and said hydrogen gas are supplied to said processing chamber while changing flow amount of one or more of the above gas, in repeating said gas supply and exhaust step by the selected number of times.

9. The manufacturing method of the semiconductor apparatus according to claim 8, wherein said gas supply and exhaust step is further repeated by the selected number of times, by decreasing flow amount of at least said chlorine-containing gas, after repeating the selected number of times of said gas supply and exhaust step.

10. The manufacturing method of the semiconductor apparatus according to claim 8, wherein said gas supply and exhaust step is further repeated by the selected number of times, by increasing flow amount of at least said silicon-containing gas, after the repeating selected number of times of said gas supply and exhaust step.

11. The manufacturing method of the semiconductor apparatus according to claim 8, wherein said gas supply and exhaust step is further repeated by the selected number of times, by increasing flow amount of at least said silicon-containing gas and said chlorine-containing gas, after repeating the selected number of times of said gas supply and exhaust step.

12. The manufacturing method of the semiconductor apparatus according to claim 1, wherein, in said gas supply and exhaust step, pressure of the inside of said processing chamber is changed in repeating said gas supply and exhaust step by the selected number of times.

* * * * *